United States Patent [19]

Shinada et al.

[11] Patent Number: 4,803,430
[45] Date of Patent: Feb. 7, 1989

[54] MAGNETIC/ELECTRIC FIELD MEASURING DEVICE BY MEANS OF AN ELECTRON BEAM

[75] Inventors: Hiroyuki Shinada, Chofu; Hideo Todokoro, Tokyo; Satoru Fukuhara, Kokubunji, all of Japan

[73] Assignee: Hitachi, Ltd., Tokyo, Japan

[21] Appl. No.: 154,183

[22] Filed: Feb. 8, 1988

[30] Foreign Application Priority Data

Feb. 20, 1987 [JP] Japan .................................. 62-35513

[51] Int. Cl.$^4$ ...................... G01R 33/02; G01R 29/14
[52] U.S. Cl. ...................................... 324/250; 324/72; 324/501
[58] Field of Search ............. 324/158 R, 158 D, 71.3, 324/501, 250, 72; 250/310, 311

[56] References Cited

FOREIGN PATENT DOCUMENTS 868659 9/1981 U.S.S.R. ............................... 324/250
898350 1/1982 U.S.S.R. ............................... 324/250

OTHER PUBLICATIONS

Hutchison et al., IBM Tech. Disclosure Bulletin, vol. 11, No. 10 Mar. 1969.
Appl. Phys. Lett., vol. 42, No. 1, Jan. 1, 1983, Wells and Brunner, pp. 114–116.
IEEE Transactions on Magnetics, vol. Mac.-20, No. 5, Sep. 1984, Elsbrock and Balk, pp. 866–868.

Primary Examiner—Reinhard J. Eisenzopf
Assistant Examiner—Anthony L. Miele
Attorney, Agent, or Firm—Antonelli, Terry & Wands

[57] ABSTRACT

A magnetic/electric field measuring device is disclosed, which is provided with an electron beam generator for generating an electron beam finely focused; a sample table, on which a sample is placed; electron beam deflectors for sweeping the electron beam two-dimensionally along an end surface of the sample; two-dimensional semiconductor position detection element using a photodiode for detecting the incident position of the electron beam, which has passed along the end surface of the sample; and a display section for displaying the position signal coming from said two-dimensional semiconductor position detection element in synchronism with a scan signal for the electron beam.

9 Claims, 4 Drawing Sheets

MAGNETIC/ELECTRIC FIELD MEASURING DEVICE BY MEANS OF AN ELECTRON BEAM

BACKGROUND OF THE INVENTION

This invention relates to a magnetic/electric field measuring device by means of an electron beam, which is capable of measuring quantitatively magnetic or electric field generated on a surface of a sample and measuring the distribution thereof in real time.

Several methods are known, by which magnetic stray field is detected by means of an electron beam. In a prior art example, which is nearest to this invention among them, deflection of an electron beam is sensed by a detector for detecting the incident position of the electron beam and magnetic stray field is calculated on the basis thereof (IEEE Trans. Magnetics, MAG 20 No. 5 (1986) p. 866–p. 868). By this method the electron beam is made to pass pallarelly to a surface of a magnetic recording head or a magnetic tape and the position of the arrival of the electron beam deflected by magnetic stray field is sensed, on the basis of which the intensity and the direction of the magnetic stray field are calculated. A microchannel plate (hereinbelow abbreviated to MCP), a phosphor screen and a television camera are used for the detection of the impingement position of the electron beam. The bright position generated by the incident electron beam is sensed by the television camera, the image of which is taken in a digital video frame memory and treated further in a CPU so that the distribution of the magnetic stray field is obtained.

By this method there are three restrictions stated below.

Firstly a video memory is necessary, which stores the position of the bright point on the trajectory of the bright point resulting from displacement of the electron beam in the form of an image. Therefore the device processing data stored in the memory and calculating the intensity of the magnetic field is large. In addition it is impossible to detect and display in real time the positional distribution of the magnetic stray field in synchronism with the scanning with the electron beam.

Secondly the positional resolving power of the electron beam incident position is limited by the channel diameter of the MCP, which is several $\mu$m.

Thirdly, when the electron beam is focused on a measurement point in the proximity of the surface of the sample, it becomes broader on the MCP. As a result, the bright point on the phosphor screen has a large diameter. Consequently it is impossible to detect extremely small positional variations.

SUMMARY OF THE INVENTION

An object of this invention is to provide a magnetic/electric field measuring device by means of an electron beam having a simple construction, which is capable of measuring a two-dimensional distribution of a magnetic or electric field in real time.

The above object is achieved by using a position sensing detector utilizing a photodiode as means for detecting the incident position of the electron beam, which is sensitive to the electron beam and capable of outputting a signal representing the incident position in real time, and by displaying signals representing the position of the beam outputted by the position sensing detector in synchronism with the scanning with the electron beam.

According to this invention, since the position of the electron beam is detected by a semiconductor position sensing detector using a photodiode and signals representing the position obtained by the position sensing detector are displayed in synchronism with scanning of the electron beam, it is possible to measure the distribution of a magnetic or electric field in real time.

Explaining the operation of this invention more in detail, the magnetic/electric field measuring device according to this invention is constructed such that the electron beam passes at the proximity of the end surface of the sample and enters the position sensing detector. When there exists a magnetic stray field in the direction (x-direction) parallel to the end surface of the sample, the electron beam is deviated in the y-direction by the Lorentz force. Since the position sensing device can output the incident position of the electron beam in real time, it is possible to detect the intensity of the magnetic stray field in the x-direction in synchronism with the scanning the electron beam by using the y-direction component signal from the position sensing detector.

By the principle similar to that described above it is possible to measure the distribution of the y-direction magnetic field by using the x-direction component signal from the position sensing detector.

Although explanation has been given in the above, by taking the detection of the magnetic stray field as an example, electric field can be measured in a similar way only by substituting the x- and y-directions for each other.

DESCRIPTION OF THE PREFERRED EMBODIMENTS

Figure 1:
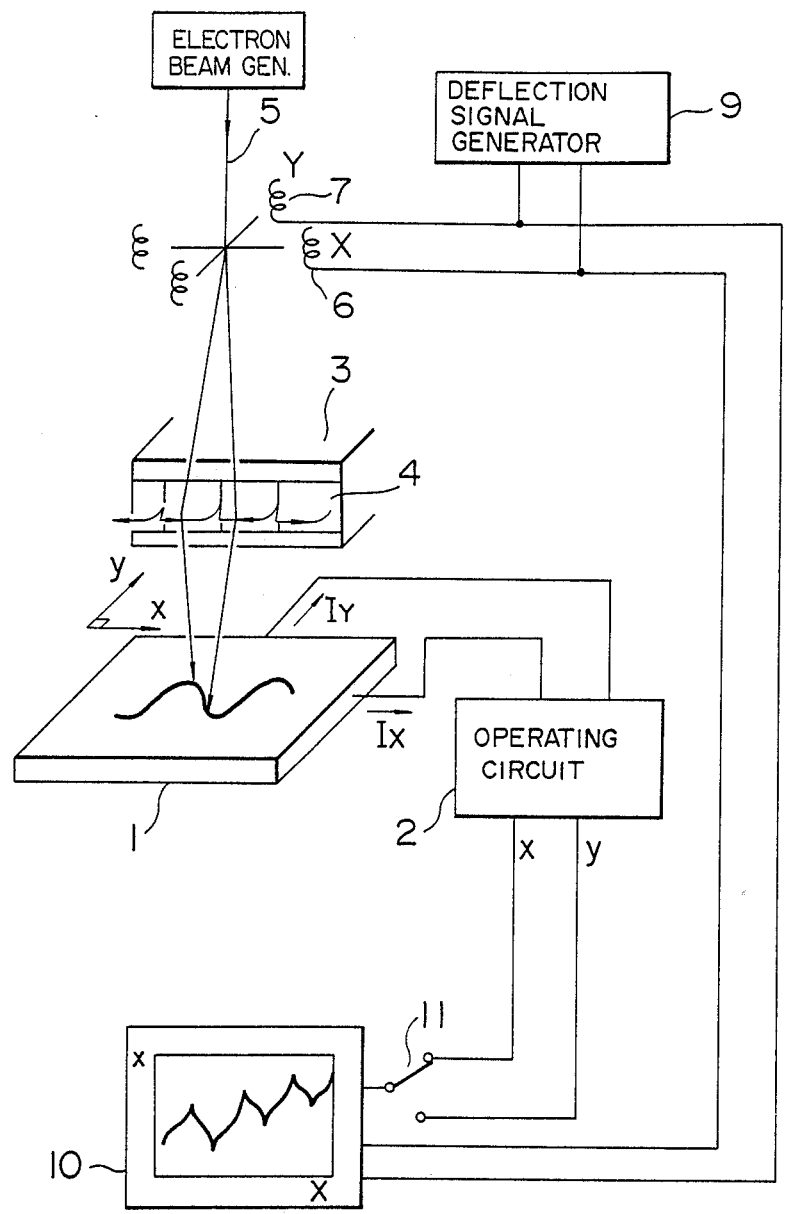
FIG. 1 is a construction scheme illustrating the basic construction of the device according to this invention.

Hereinbelow an embodiment of this invention will be explained, referring to FIG. 1. A position sensing detector 1, a sample table 3 and a sample 4 are located in a vacuum chamber, e.g. in a sample room of a scanning electron microscope and an electron beam 5 passes at the proximity of the end surface of the sample, 4. The electron beam 5 can be moved or scanned by deflectors 6 and 7. As the position sensing detector 1 an element is used, which consists e.g. of a silicon photodiode and a resistive layer disposed on the surface thereof and the resistive layer divides an electric current induced by the incident electron beam into four, the branching ratio of this current being used to detect the position of the incident electron beam. This element outputs 2-dimensional position signals x and y through an operating circuit 2. These signals represent the intensity of the magnetic stray field of the sample, the x-direction position signal representing the intensity of the magnetic stray field in the y-direction, the y-direction position signal representing the intensity of the magnetic stray field in the x-direction. One of the 2-dimensional position signals x and y can be selected by means of a switch 11 and inputted in a CRT (cathode ray tube) 10 in synchronism with the beam deflection signal as a brightness modulation signal or a y-axis modulation signal. It may be inputted also in a color CRT as a chrominance modulation signal. In this way it is possible to display the intensity distribution of the magnetic stray fields Bx and By on the CRT in synchronism with the scanning with the electron beam 5. When the x-signal is used for the x-axis modulation of the CRT and the y-signal is used for the y-axis modulation, a trajectory of the electron beam on the CRT is traced, with which the intensity of the magnetic field can be evaluated.

Figure 2:
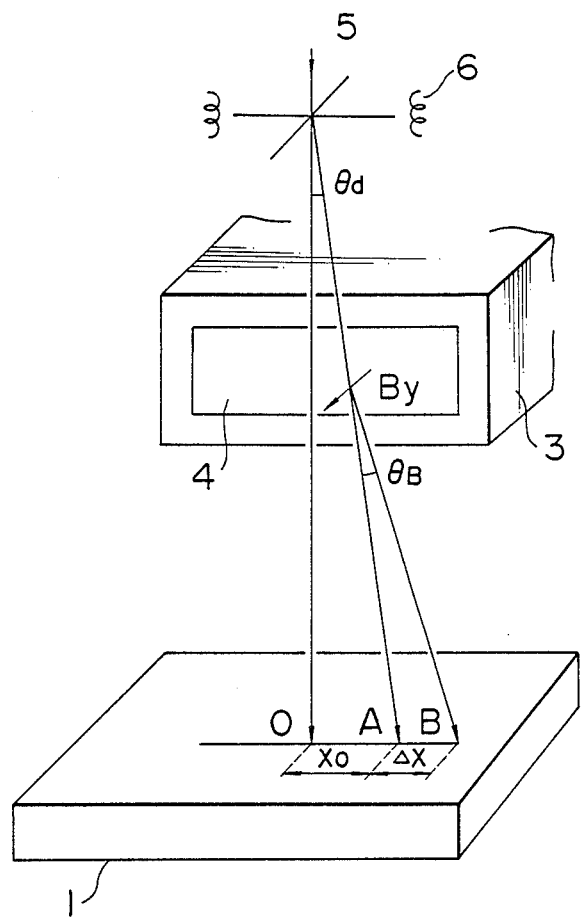
FIG. 2 is an explanation scheme for explaining the operation of this invention.

However, with the construction described above, the deflection of the electron beam due to the magnetic stray field and variations in the position due to the scanning with the electron beam are detected simultaneously. The principle for correcting errors produced by this fact will be explained, referring to FIG. 2. It is supposed that the electron beam 5 deflected by an angle $\theta_d$ by a deflection signal $I_{x\ def}$ applied to a deflector 6 is further deflected by an angle $\theta_\beta$ by the magnetic field from the sample. At this time the output x of the position sensing detector can be represented by the following equation;

$$x = x_0 + \Delta x$$

Among these terms $\Delta x$ represents the deflection component due to the magnetic field, which is proportional to the intensity of the magnetic field. $x_0$ is proportional to the deflection signal $I_{x\ def}$. Since the proportional constant can be obtained previously, it is possible to take out only the signal $\Delta x$, which is proportional to the magnetic stray field $B_y$ by multiplying the deflection signal $I_{x\ def}$ by a certain constant through an amplifier and subtracting the result thus obtained from the signal x coming from the position sensing detector.

In the same way it is possible to obtain a signal, which is proportional to the magnetic stray field $B_x$ by multiplying the deflection signal $I_{y\ def}$ and subtracting the result thus obtained from the output of the position sensing detector 1 in the y-direction.

Figure 3:
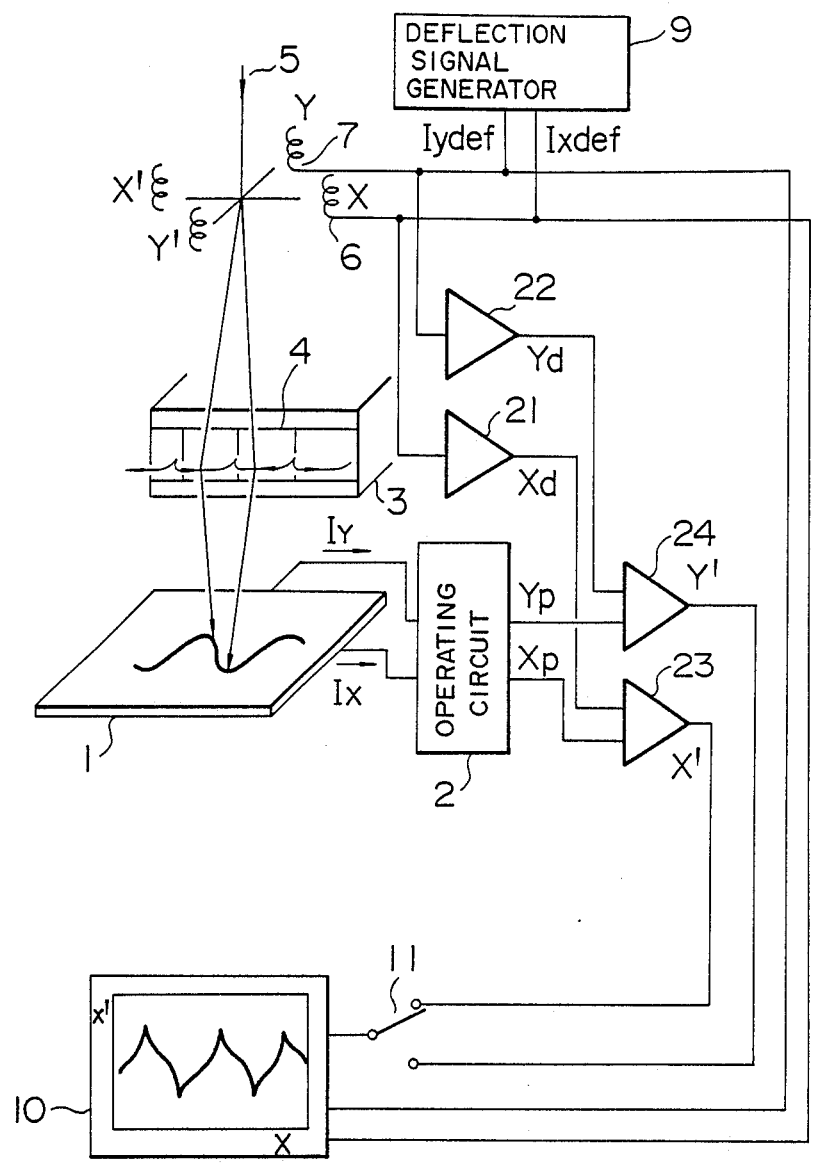
FIG. 3 is a construction scheme illustrating a second embodiment of this invention.

A second embodiment on the basis of the knowledge described above will be explained below, referring to FIG. 3. In this embodiment a circuit for cancelling the amount of the deflection of the electron beam is added to the structure of the first embodiment. The circuit for cancelling the amount of the deflection of the electron beam consists of an amplifier 21 multiplying the electron beam deflection signal $I_{x\ def}$ in the x-direction by a constant, an amplifier 22 multiplying the electron beam deflection signal $I_{y\ def}$ in the y-direction by a constant, and subtracters 23 and 24 subtracting output signals $X_d$ and $Y_d$ of the amplifiers 21 and 22 from the outputs $x_p$ and $y_p$ of the position sensing detectors, respectively. The gains of the amplifiers 21 and 22 are so regulated that, when the sample 4 is removed and the position sensing detector 1 is 2-dimensionally scanned with the electron beam 5, the outputs of the subtracters 23 and 24 are zero. In this way the outputs of the subtracters are proportional to the intensities of the magnetic stray field. According to this second embodiment it is possible to measure the distribution of magnetic field with a precision higher than that obtained by the first embodiment by inputting this signal in the cathode ray tube 11, which is in synchronism with the electron beam scanning signal, because variations in the position due to the scanning with the electron beam are cancelled.

Figure 4:
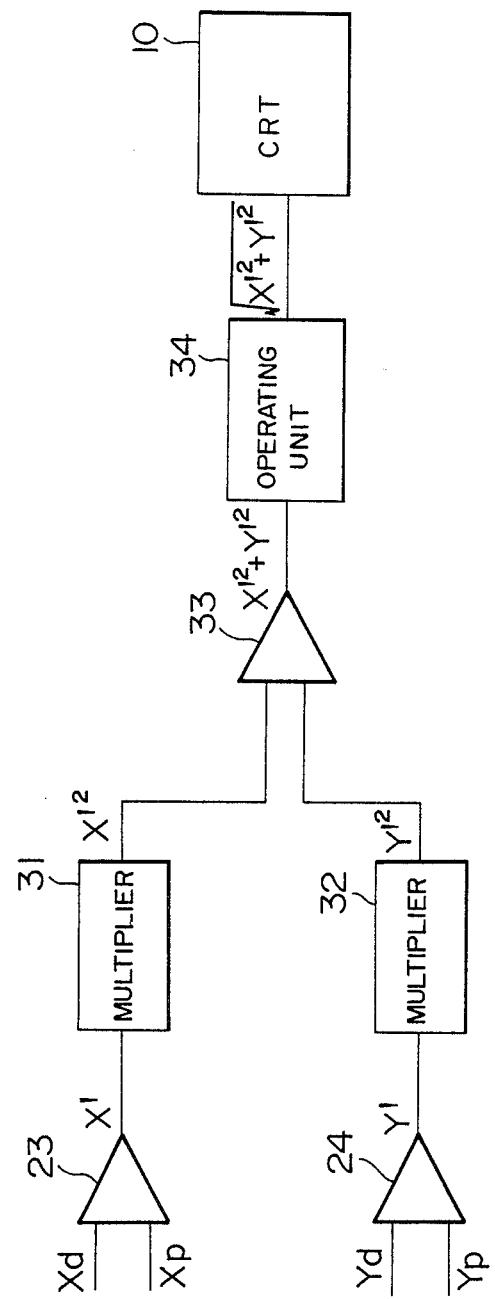
FIG. 4 is a block diagram of a signal processing circuit newly added in a third embodiment of this invention.

A third embodiment is an embodiment in which a signal processing circuit as indicated in FIG. 4 is further added to the second embodiment. This circuit consists of multipliers 31, 32, an adder 33 and an operating circuit 34 outputting the square root. The multipliers 31 and 32 square signals X' and Y', respectively, coming from the subtracter and the adder 33 adds the two signals thus obtained. Further the operating circuit 34 forms the square root of this signal. The signals X' and Y' are proportional to the intensity of the magnetic stray field.

$$X' = kB_y, \quad Y' = kB_x$$

Consequently the output S of the operating circuit 34 is given by:

$$S = \sqrt{X'^2 + Y'^2} = k\sqrt{B_x^2 + B_y^2},$$

where k is a proportional constant which represents the absolute value of the magnetic stray field. The third embodiment is so constructed that this signal is inputted as the brightness signal or the y-axis modulation signal or the chrominance modulation signal in the cathode ray tube, which is in synchronism with the electron beam sweeping signal, as in the first and the second embodiments. Consequently, according to this embodiment, it is possible to measure the absolute value of the magnetic stray field in synchronism with the scanning with the electron beam 5.

The special effect in the cases where an element provided with a resistive layer disposed on the surface of a silicon photodiode, which is sensitive also for the electron beam, stated previously (hereinbelow abbreviated to PSD) for the position detecting element 1, is used in the embodiments described above, will be explained below. The positional resolving power of this element (PSD) is determined by its S/N ratio, independently from its structure, differently from the detector, whose photosensitive surface consists of small detectors arranged closely to each other. Consequently it has a feature that its resolving power can be increased principally as highly as desired by increasing the number of incident electrons or the gain in PSD with respect to electrons. In addition, since branching of electric current by the resistive layer is applied, the signal represents the position of the center of gravity of the incident electron beam. Consequently the invention is characterized in that, even if the diameter of the arriving electron beam is large, positional variations, which are smaller than the diameter, can be sufficiently well detected. When this element PSD is utilized for realizing this invention, it is possible to detect very weak magnetic field owing to the increase in the S/N ratio and an effect that the resolution for positional variations of the electron beam, i.e. the sensitivity for the magnetic field, is not lowered, even if the electron beam, which is focused at the neighborhood of the sample, is strongly enlarged at the surface of the position detection element (PSD), can be obtained.

According to this invention, since the intensity of a magnetic or electric field is obtained in the form of an electric signal synchronized with scanning of the electron beam, it is possible to measure the two-dimensional distribution of the magnetic or electric field in real time.

We claim:

1. A magnetic/electric field measuring device comprising:
   electron beam generating means for generating an electron beam finely focused;
   a sample table, on which a sample is to be placed;
   electron beam deflecting means for scanning said electron beam two-dimensionally along an end surface of said sample;
   two-dimensional semiconductor position detection element for generating a position signal corresponding to the incident position of said electron beam, which has passed along the end surface of said sample; and
   a display section for displaying the position signal coming from said two-dimensional semiconductor position detection element in synchronism with a scan signal for said electron beam.

2. A magnetic/electric field measuring device according to claim 1, wherein said two-dimensional semiconductor position detection element is an element utilizing a photodiode.

3. A magnetic/electric field measuring device according to claim 1, wherein said two-dimensional semiconductor position detection element is a silicon photodiode, on the surface of which a resistive layer is disposed.

4. A magnetic/electric field measuring device according to claim 1, wherein said display section is constituted by a cathode ray tube and it comprises further means for dividing said position signal into an X-direction component for the direction which is parallel to the surface of said sample and a Y-direction component for the direction which is perpendicular thereto.

5. A magnetic/electric field measuring device according to claim 4, wherein at least one of said X- and Y-direction components is used as the brightness modulation input for said cathode ray tube.

6. A magnetic/electric field measuring device according to claim 4, wherein at least one of said X- and Y-direction components is used as the Y-axis modulation input for said cathode ray tube.

7. A magnetic/electric field measuring device according to claim 4, wherein said cathode ray tube is a color cathode ray tube and at least one of said X- and Y-direction components is used as the chrominance modulation input for said cathode ray tube.

8. A magnetic/electric field measuring device according to claim 4, wherein said X- and Y-direction components are inputted in said cathode ray tube through an electron beam deflection cancelling circuit, in which values obtained by multiplying them by a constant are subtracted therefrom for the respective directions.

9. A magnetic/electric field measuring device according to claim 8, wherein a signal processing circuit is disposed, which squares the X- and Y-direction component signals coming from said electron beam deflection cancelling circuit, adds them and extracts the square root of the result thus obtained and the signal obtained by said signal processing circuit is inputted in said cathode ray tube.

* * * * *